United States Patent [19]

Ballantyne

[11] 4,065,780

[45] Dec. 27, 1977

[54] TUNNEL INJECTION OF MINORITY CARRIERS IN SEMI-CONDUCTORS

[75] Inventor: Joseph M. Ballantyne, Ithaca, N.Y.

[73] Assignee: Cornell Research Foundation, Inc., Ithaca, N.Y.

[21] Appl. No.: 638,406

[22] Filed: Dec. 8, 1975

[51] Int. Cl.² .................... H01L 49/02; H01L 33/00
[52] U.S. Cl. .......................................... 357/6; 357/4; 357/17; 357/52
[58] Field of Search ............................ 357/6, 4, 17, 52

[56] References Cited

U.S. PATENT DOCUMENTS

| | | | |
|---|---|---|---|
| 3,267,317 | 8/1966 | Fischer | 313/108 |
| 3,353,114 | 11/1967 | Hanks | 331/94.5 |
| 3,424,934 | 1/1969 | Berglund | 313/108 |
| 3,462,630 | 8/1969 | Cuthbert | 313/108 |
| 3,849,707 | 11/1974 | Braslau | 357/17 |

Primary Examiner—Martin N. Edlow
Attorney, Agent, or Firm—Jones, Tullar & Cooper

[57] ABSTRACT

Disclosed are multi-layer thin-film devices having adjacent insulator-semiconductor layers employing n-or-p-type semiconductors wherein a charge maintained at the insulator-semiconductor interface creates a depletion region that substantially suppresses tunneling of majority carriers while enhancing tunneling of minority carriers. When employed in a metal-insulator semiconductor (MIS) device wherein the semiconductor is a compound such as gallium arsenide (GaAs) or Cadmium Sulfide (CdS), such minority carrier injection substantially increases the luminescence efficiency.

8 Claims, 7 Drawing Figures

MIS STRUCTURE

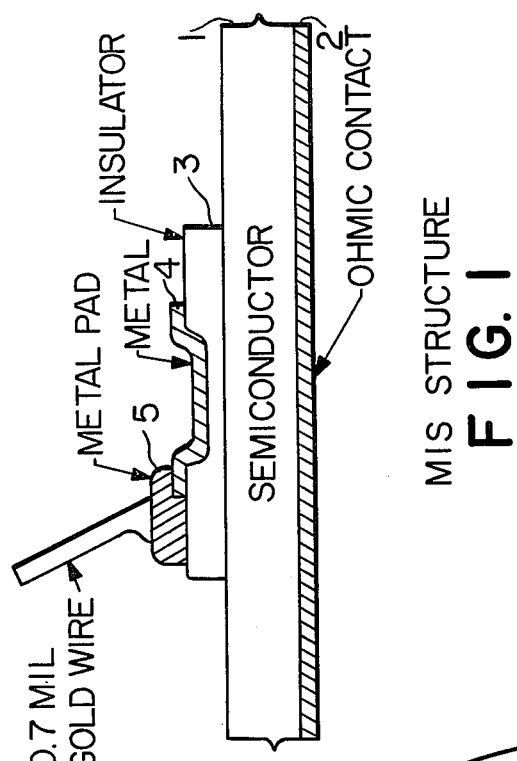
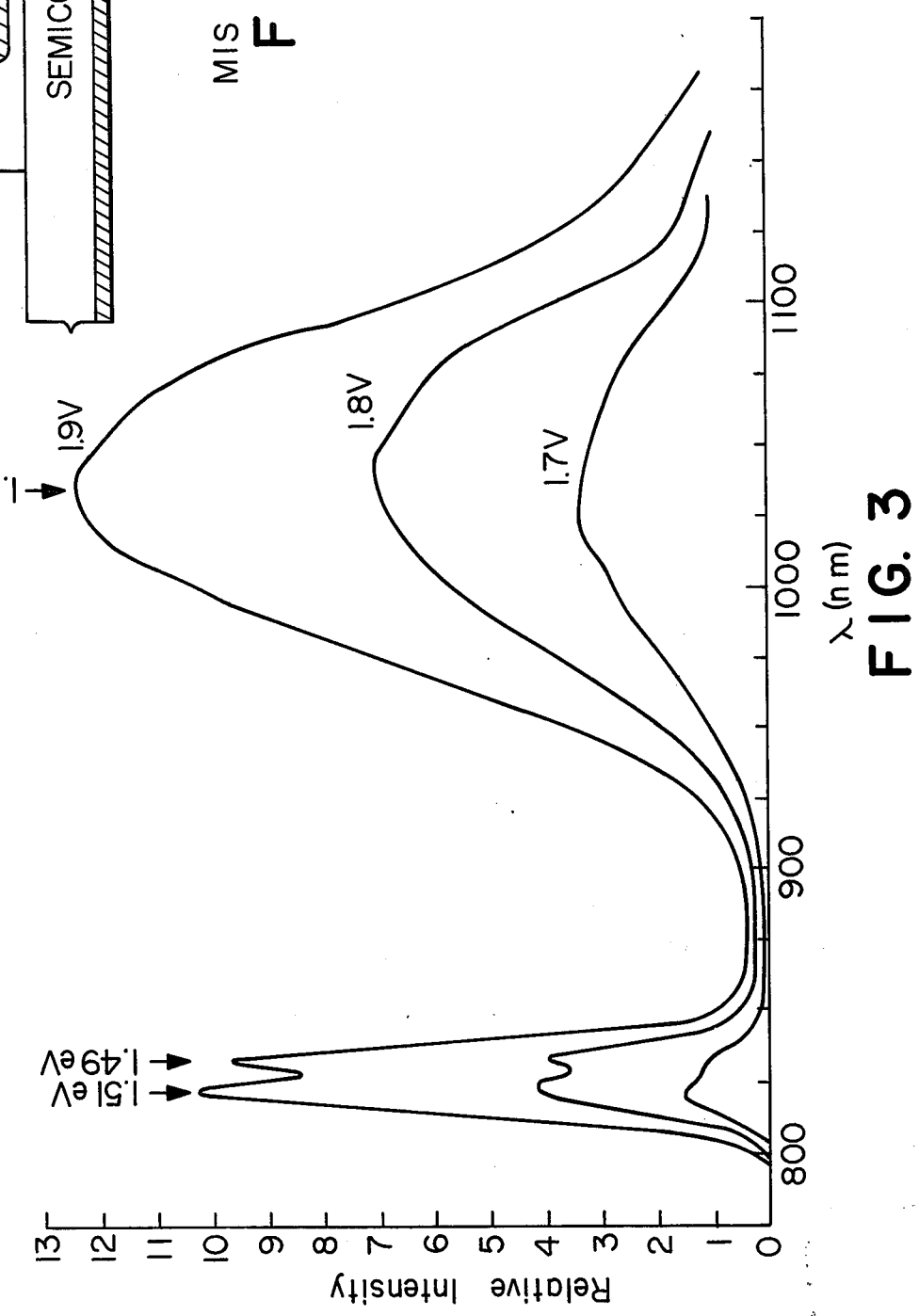

TUNNEL INJECTION OF MINORITY CARRIERS IN SEMI-CONDUCTORS

The invention herein described was made in the course of or under a contract or subcontract thereunder with the Office of Naval Research.

BACKGROUND OF THE INVENTION

Over the years there has been considerable interest in the possibility of using tunnel-injection of minority carriers into direct-gap semiconductors as an alternative to a p-n junction in electroluminescent devices. Previous attempts to fabricate metal-insulator-semiconductor (MIS) tunneling structures with various III-V and II-VI compound semiconductors generally resulted in devices which were inefficient injectors. In many cases, these devices required voltages large compared to the bandgap so that impact ionization rather than tunneling may have been the source of the minority carriers. Lack of a good native oxide has hindered fabrication of good tunneling devices on compound semiconductors. Descriptions of some of those prior devices are presented in:

R. C. Jaklevic, P. K. Donald, J. Lambe, and W. C. Vassell, *Apply. Phys. Letters* 2, 7 (1963);

A. B. Fischer and H. I. Moss, J. Appl. Phys. 34, 2112 (1963);

M. G. Miksic, G. Mandel, F. F. Morehead, A. A. Onton, and E. S. Schlig, *Phys. Letters* 11, 202 (1964);

D. D. O'Sullivan and E. C. Malarkey, *Appl. Phys. Letters*, 6, 5 (1965);

L. F. Rosenkrantz and J. M. Ballantyne, Proc. IEEE 56, 115 (1968);

J. H. Yee and G. A. Condas, *Solid State Elec.* 11, 419 (1968);

H. C. Card and B. L. Smith, *J. Appl. Phys.* 42, 5863 (1971); and H. C. Card and E. H. Rhoderick, *Solid State Electronics* 16, 365 (1973).

SUMMARY OF THE INVENTION

In accordance with the principles of this invention MIS devices are provided in which the insulator and the semiconductor provide an interface such that a charge maintained near the interface creates a depletion region that substantially suppresses majority carrier tunneling while greatly enhancing minority carrier injection.

A feature of this invention is that a fabrication technique employs, e.g., sputter etching or ion milling under high vacuum of the surface of the semiconductor adjacent to the insulator. Such a technique results in a semiconductor surface which is free of oxides and contaminates.

BRIEF DESCRIPTION OF THE DRAWINGS

FIG. 1 is a schematic diagram showing cross sections of a metal-insulator-semiconductor structure.

FIG. 3 is a family of curves showing GaAs device electroluminescence spectra at three bias levels.

Figure 2:
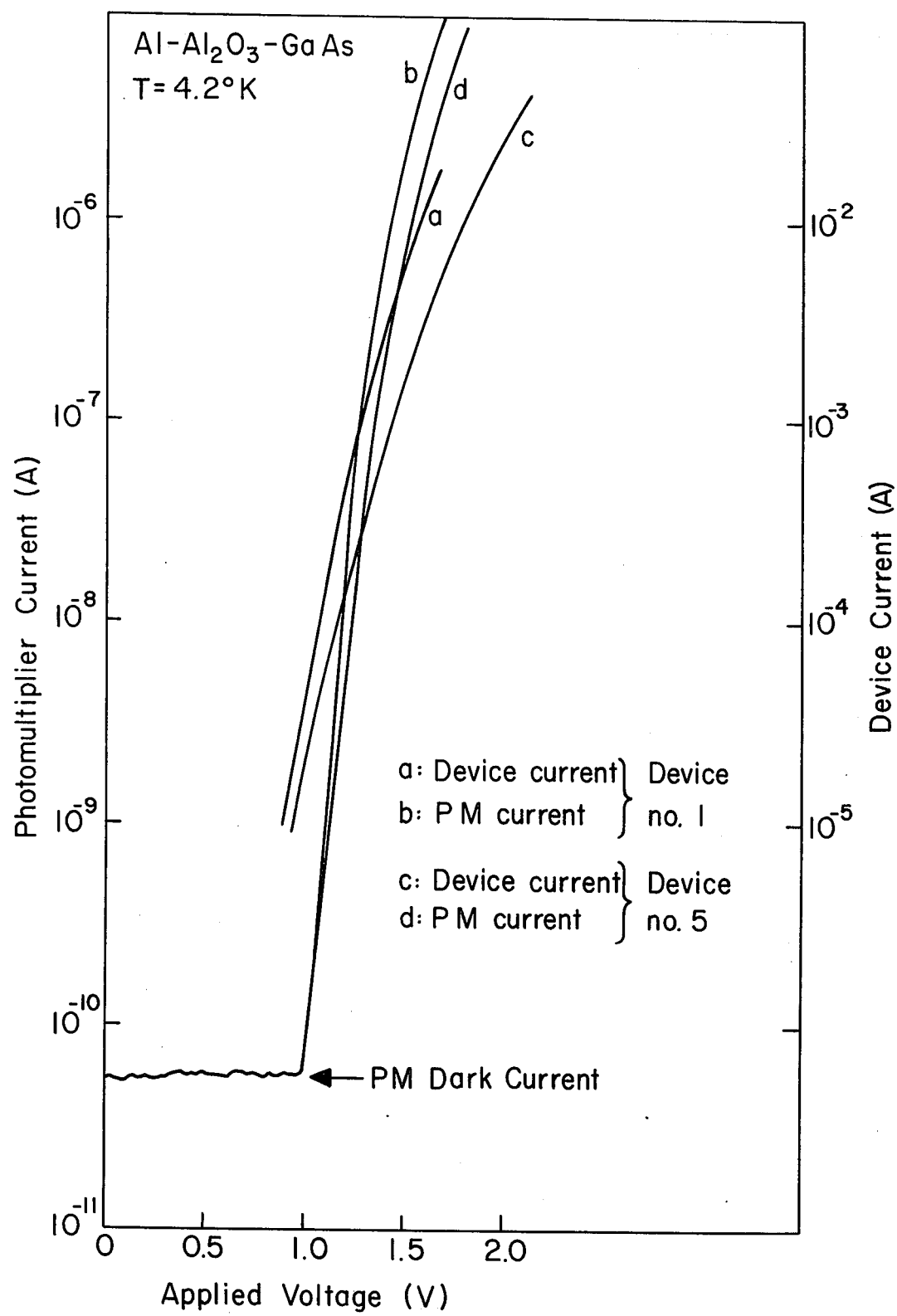
FIG. 2 is a family of curves showing photomultiplier current response to DC electroluminescence versus device bias, and I(V) for Al-Al$_2$O$_3$-GaAs devices.

$\phi_1 = 1.5$ eV, $m_{cs} = 0.068$m, $m_{vs} = 0.082$m, $E_{gs} = 1.5$ e$_v$, $N_d = 5 \times 10^{18}$ cm$^{-3}$, $\phi_m = 2.0$ eV, $m_{ci} - m_{vi} = 0.4$m, $S = 20$ A.

DESCRIPTION OF PREFERRED EMBODIMENT

FIG. 1 shows a semiconductor substrate which may consist of a chip 1 of GaAs or CdS which may be soldered via Au:Ge eutectic or In, respectively, to suitable header or ohmic contact 2. The GaAs chips are preferably sawn, lapped and chemomechanically polished (1 part "Clorox" to 15 parts deionized water with a "Pellon Pan-W" polishing pad) from 10$^{18}$ cm$^{-3}$ Te-doped, Czochralski-grown wafers ($\mu = 2840$ cm$^2$/V-sec, $\rho = 0.0053$ ohm-cm), and the CdS chips are preferably cleaved from laser-quality n-type platelets (grown in Cd overpressure) supplied by D. C. Reynolds. Before insertion into the vacuum system used for film deposition, the mounted GaAs chips were etched for about 1 min. in H$_2$O$_2$ (30%): H$_2$SO$_4$ (1:10) and rinsed in deionized water. CdS chips were etched with 6M HCl prior to mounting on the header, but were not etched before insertion into the vacuum system because the etchant would attack the In solder.

All subsequent fabrication steps are preferably carried out in an oil-free, ion-pumped vacuum system without breaking vacuum. Steps may consist of a sputter-etch of the semiconductor surface in high-purity Ar (200 sec. at 850 V and ~ 77 $\mu$ A/cm$^2$), and electron-beam evaporation of three Al$_2$O$_3$ layers to form an insulator 3 and two metal layers to form a metal 4, and metal pad 5. The metals may be Al for GaAs devices and Pt for CdS devices. Structures (several per substrate) may be delineated by four thin Mo masks, indexed to ±10 $\mu$m by a precision mask-changer. Thickness may be shutter-controlled and monitored by a quartz crystal oscillator. Average thickness can be controllable to about ±20% for layers ≦ 20 nm thick, and to higher precision for thicker layers. Pressure during deposition of metals is preferably less than $5 \times 10^{-7}$ torr, and may be about $4 \times 10^{-5}$ torr during Al$_2$O$_3$ deposition. High deposition pressure is essential for a high-quality Al$_2$O$_3$ film. The three Al$_2$O$_3$ depositions result in the insulator thickness profile shown in FIG. 1 — a thin (5–20 nm thick) central region about $10^{-4}$ cm$^2$ in area, surrounded by a thick (50–200 nm) guard ring which separates the edges of the metal films from the substrate. Leads may be connected by nail-head thermo-compression bonding of 0.7 Au wires. GaAs devices are preferably maintained at the bonding temperature of 315° C for about one hour, which possibly annealed some lattice damage resulting from the sputter-etch, while leads to CdS devices may be bonded at 100° C.

A critical part of the fabrication process for producing well behaved tunnel junctions is the sputter-etch (or other suitable cleaning step) followed by vapor depositions while maintaining high vacuum.

Broad-band, DC electroluminescence and I(V) curves typical of Al-Al$_2$O$_3$-GaAs devices are shown in FIG. 2. The optical detector was a cooled, S-1 cathode photomultiplier. The two curves are for two different devices fabricated simultaneously on the same substrate, and show that reasonable device-to-device reproducibility is obtained. Electroluminescence turns on very abruptly at an applied voltage (Al positive) of about two-thirds the semiconductor bandgap.

Emission spectra for these devices, corrected for instrumental spectral response, are shown in FIG. 3 for three applied voltages with the device at 77° K. The 1.51 eV peak corresponds to band-to-band recombination, while the 1.49 eV peak is apparently due to recombination at an acceptor. The broad emission band, peaked at 1.2 eV, is commonly observed in melt-grown, Te-doped GaAs and has been well identified in the literature: E. W. Williams and H. B. Bebb, "Photoluminescence II: Gallium Arsenide," in *Semiconductors and Semimetals,* Vol. 8, (R. K. Willardson and A. C. Beer, eds.) p. 359, Academic Press, New York, (1972) — as due to a Ga vacancy-Te donor complex. Additional measurements show that the relative intensity of this 1.2 eV band is considerably lower at 4.2° K.

Figure 4:
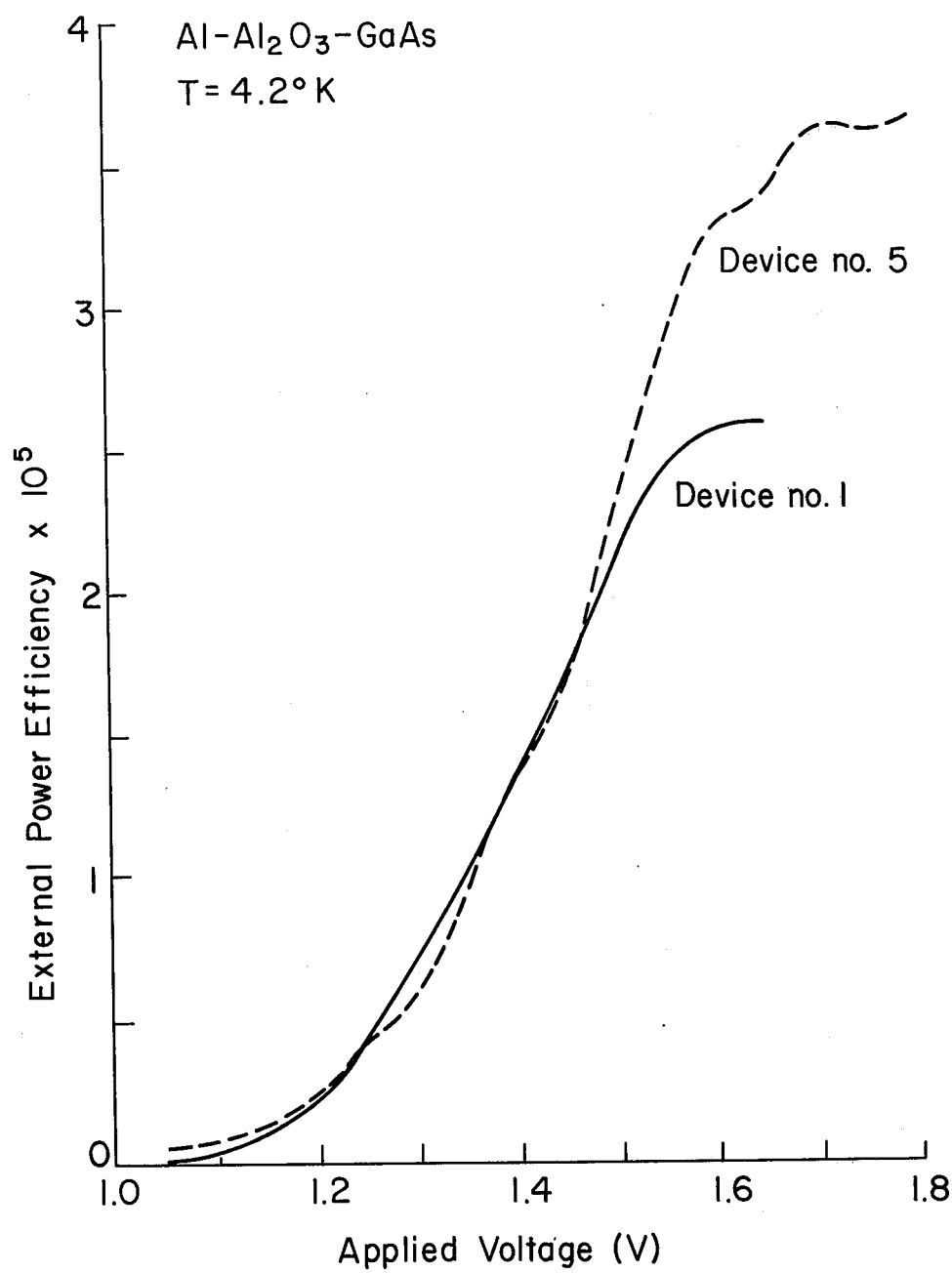
FIG. 4 is a family of curves showing electroluminescence external power efficiency versus bias for GaAs devices.

When the data of FIG. 2 are corrected for the photomultiplier responsivity and for the measurement geometry by assuming the devices are Lambertian emitters, a maximum emitted power of about 1μW can be noted. The external power efficiency as a function of applied voltage is shown in FIG. 4. As can be seen, the external efficiency is low, but the configuration of these devices is not conducive to high external efficiency because most of the emission emerges through the Al film (58 nm thick) which reduces the intensity by a factor of $1.5 \times 10^{-4}$ due to reflection and absorption. The spatial distribution of emitted light has been determined with infrared photomicrographs which show that emission from the active region is far brighter than that which emerges from the crystal outside the area covered by the Al film, and that well over 90% of the light flux emerges from the metal film over the active area. The photographs also show approximately uniform brightness over the active area with the device at 4.2° K, while at 77° K, emission from the active area becomes more spotty, probably indicating that injection becomes less uniform at higher temperatures.

With the knowledge that the detected emission passes through the Al film, the fraction of the internal emission which reaches the detector has been calculated from the optical parameters of GaAs and Al, the thickness of the Al film, and the experimental geometry. The internal emitted power has thus been obtained from the data of FIG. 2 and, by assuming a radiative recombination efficiency of 1, we find that the DC injection efficiency at 4.2° K is about unity.

The effect of the tunneling-barrier film was tested by measurements on devices which were identical to the Al-Al$_2$O$_3$-GaAs devices except for omission of the thin Al$_2$O$_3$, thus forming an Al-GaAs structure in the active area. These structures showed substantially different I(V) behavior, and emitted only barely detectable electroluminescence, several orders-of-magnitude less intense than that from the MIS devices at the same device current. The much higher efficiency of the MIS structures indicates tunneling rather than bulk generation or a surface inversion layer as the source of the minority carriers.

The high hole injection efficiency observed for these Al-Al$_2$O$_3$-GaAs structures is believed due to substantial band-bending in the GaAs, which is maintained by the charge on occupied states at the Al$_2$O$_3$-GaAs, interface. The barrier posed by this depletion region tends to suppress tunneling from the conduction band to the metal, while reducing the voltage threshold for tunneling from the valence band (i.e. hole injection) and the resulting luminescence. This agrees with the observed low luminescence threshold voltage. The model also predicts strong temperature dependence for tunneling from the conduction band but weak temperature dependence for hole tunneling. Thus in the voltage regime where injection efficiency is near unit (V > 1.5V), the device current is nearly all hole tunneling and should show little temperature variation, which was experimentally found to be the case.

The Pt-Al$_2$O$_3$-CdS devices show behavior similar to FIG. 2 except the turn-on of electroluminescence is not as steep and occurs at a voltage of 2.4v, which is close to the bandgap energy. These devices show a peak external efficiency of about $10^{-5}$. The lower efficiency of these devices compared to the GaAs devices is probably due to use of Pt (not as well-behaved as Al, as shown by our MIM results), and a less favorable barrier configuration with less band-bending in the CdS, as shown by the turn-on voltage.

THEORY OF OPERATION

Figure 5:
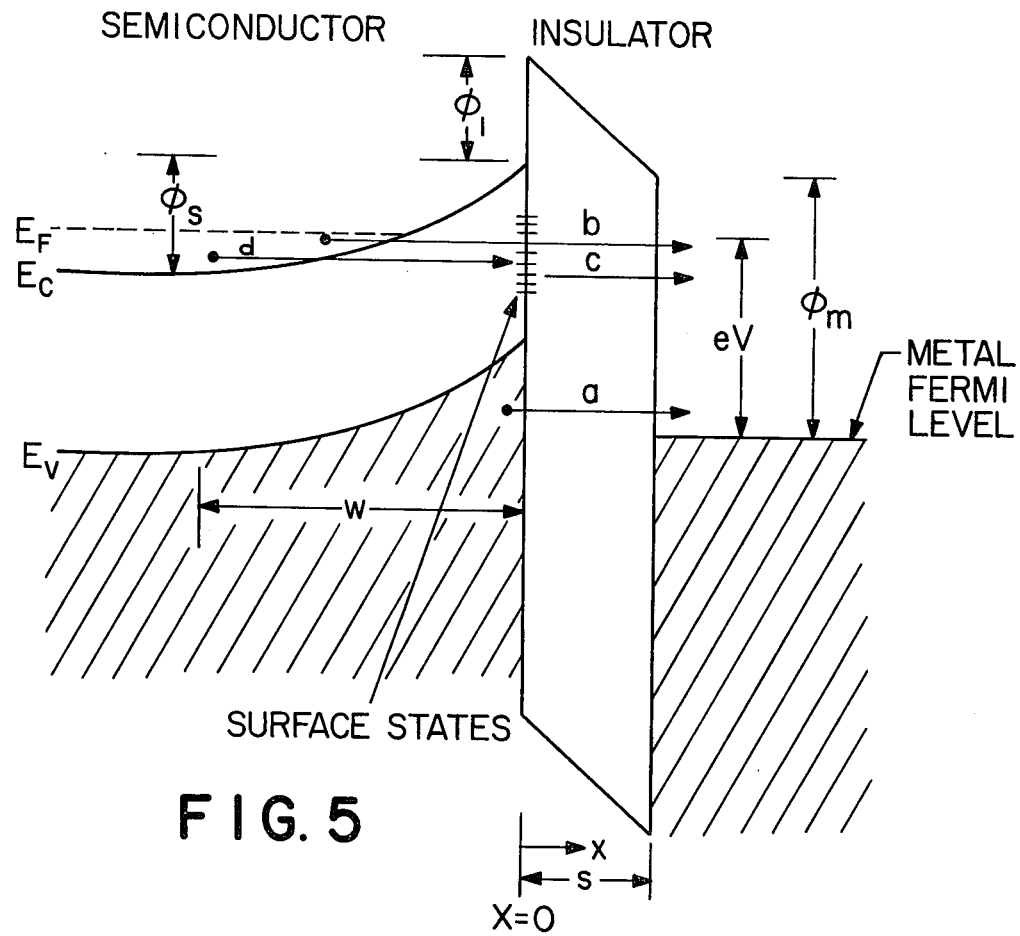
FIG. 5 is an energy-band diagram of an MIS structure with some acceptor-like surface states in the semiconductor-insulator interface.

FIG. 5 shows the energy band diagram of an MIS structure on a degenerately doped n-type semiconductor with some acceptorlike surface states in the semiconductor-insulator interface. The influence of image charge has been neglected in this diagram. In FIG. 5, $\phi_1$ is the semiconductor-insulator barrier, $\phi_s$ the band-bending in the semiconductor (may be voltage dependent), $\phi_m$ the metal-insulator barrier, and $s$ is the thickness of the insulator. Some surface states may be present in the semiconductor-insulator interface but heretofore the surface state has not been adequate to produce an efficient depletion region. In accordance with this invention a surface state may be introduced intentionally (e.g. by chemical etching and/or ion bombardment prior to the deposition of the insulator) thereby creating a desired depletion region.

Hole tunneling commences when an applied voltage (with metal positive) drives the metal Fermi level below the top of the valence band of the semiconductor. From FIG. 1, it can be seen that the threshold voltage for hole injection (process a), $V_t$ is given by $$eV_t = E_{gs} + E_F - \phi_r \qquad (1)$$

Here $e$ is the elementary charge, $E_{gs}$ the semiconductor band gap, and $E_F$ is the Fermi energy of electrons in the semiconductor, measured from the bottom of the conduction band. From Eq. (1) it is apparent that the threshold for hole tunneling may be lower than the band gap of the semiconductor. In some MIS structures on degenerately-doped GaAs, the threshold voltage is found to be about 1 V at 4.2° K as indicated in FIG. 2, which is substantially lower than the band gap of GaAs ($E_{gs}$ = 1.52 eV). This indicates that, at an applied voltage of 1 V, there is a band-bending of about 0.6 eV in the GaAs of the MIS structure.

The shape of the space charge layer in the semiconductor is approximately parabolic, and its width is given by $$w = \frac{n_s}{N_D} = \frac{2\kappa\epsilon_o\phi_s}{e^2 N_D} \qquad (2)$$

where $\kappa$ is the dielectric constant of the semiconductor, $\epsilon_o$ the permittivity of free space, $N_D$ the donor density (cm$^{-3}$) and $n_s$ is the density of occupied surface states (cm$^{-2}$). For example, when $\phi_s = 0.6$ eV, $N_D = 5 \times 10^{18}$ cm$^{-3}$ and $\kappa = 12$, the width of the depletion region will be 12.5 nm. Thus, for direct tunneling (process $b$ in FIG. 5), an electron at the bottom of the conduction band will face, in addition to the insulator barrier (typically on the order of 5 nm thick), a barrier of width 12.5 nm. This reduces the probability of direct tunneling drastically. Even for an electron with Fermi energy (e.g. $E_F = 0.15$ eV), the semiconductor barrier width is about 10 nm. At lower doping the effect of the depletion region is more pronounced; for example, when $N_D = 10^{18}$ cm$^{-3}$, the width of the depletion region for a band-bending of 0.6 eV is about 28 nm. In such a case, the majority carrier current due to direct tunneling is expected to be negligible compared to that from the surface states (process $c$ in FIG. 5).

When the majority carrier current is dominated by two-step transport via the surface states, the space charge layer is again expected to limit the current, at least at low temperatures. The surface states are emptied by tunneling through the insulator (process $c$ in FIG. 5), and filled by transport through the space charge region (process $d$). The steady state occupancy of surface states reflects a dynamic equilibrium between the two processes. Process $d$ can occur either by tunneling or by thermal emission over the barrier. At sufficiently low temperatures, tunneling will dominate, and as for one-step transport, the relatively thick space charge layer in the semiconductor will limit the majority carrier current.

Using the WKB, single electron approximation as discussed in W. A. Harrison, Phys. Rev. 123, 85 (1961), the electron tunneling current density is given by $$J_e = \frac{e}{4\pi^3 \hbar} \int dE(f_1 - f_2) \int d^2k_t \exp\left(-2 \int_{x_1}^{x_2} |k_x|\, dx\right). \tag{3}$$

Here, $E$ is the total energy, $f_1$ and $f_2$ the Fermi functions on opposite sides of the barrier, $k_t$ the component of electron wave vector parallel to the barrier surface, $x$ the distance along the tunneling direction and $k_x$ is the wave vector component in the $x$ direction; $x_1$ and $x_2$ are the classical turning points ($k_x = 0$). In this model $k_t$ and $E$ are conserved as the electron moves from one allowed region to another. Usually, $k_x$ in the barrier is expressed as $$k_x = i(-k^2 + k_t^2)^{\frac{1}{2}}. \tag{4a}$$

For a parabolic band in the semiconductor, $k_t$ is given by $$k_t^2 = \frac{2m_{cs}E_t}{\hbar^2}, \tag{4b}$$

where $m_{cs}$ is the effective mass at the conduction band edge of the semiconductor and $E_t$ is the transverse energy with a range from zero to $E$. The total momentum $k$ in the forbidden gap of the semiconductor or the insulator is given by the following generalized two-band dispersion relation:

$$-k^2 = \frac{2\epsilon}{\hbar^2} m_{cu} + (m_{vu} - 2m_{cu})\frac{\epsilon}{E_{gu}} + (m_{cu} - m_{vu})\frac{\epsilon^2}{E_{gu}^2} \tag{5}$$

In Eq. (5) $u$ represents either $s$ (semiconductor) or $i$ (insulator); $m_{cu}$ is the effective mass at the conduction band edge, $m_{vu}$ the effective mass at the valence band edge, $E_{gu}$ the band gap and $\epsilon$ is the separation of an energy level ($E$) and the conduction band edge. The quantity $\epsilon$ is given by $$\epsilon(x) = (e^2 N_D / 2\kappa\epsilon_o)(x+w)^2 - E, \quad -w \leq x \leq 0 \tag{6a}$$

$$= \phi_1 + \phi_s - E - (\phi_1 + \phi_s - \phi_m - E_F + eV)(x/s), \quad 0 \leq x \leq s. \tag{6b}$$

Figure 6:
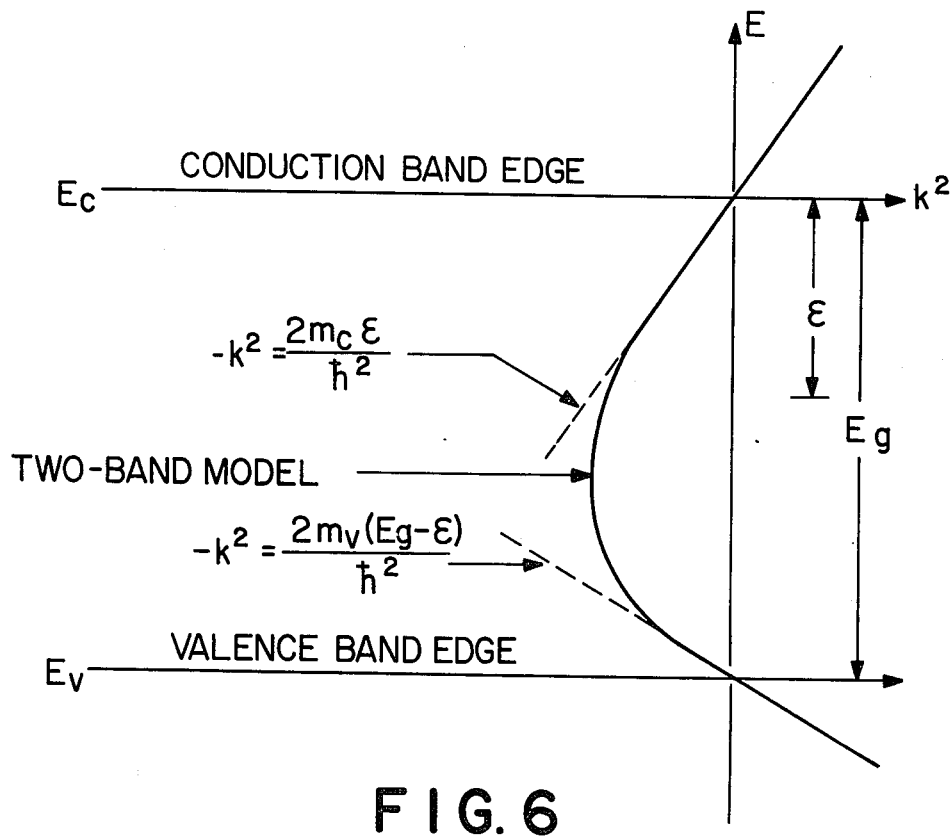
FIG. 6 shows the energy-momentum relation in the forbidden gap of a semiconductor or an insulator.

Equation (5) is similar to the relation discussed by S. G. Christov, Contemp. Phys. 13, 199 (1972). The $E(k)$ relation of Eq. (5) is illustrated in FIG. 6.

The hole current is also given by Eq. (3), but with the total energy now measured downward from the top of the valence band and with $k_t$ given by $$k_t^2 = (2m_{vs}E_t)/\hbar^2 \tag{7}$$

The total momentum $k$ follows Eq. (5), while $$\epsilon(x) = E + E_{gs} + \phi_1 - (\phi_1 + \phi_s - \phi_m - E_F + eV)(x/s). \tag{8}$$

Figure 7:
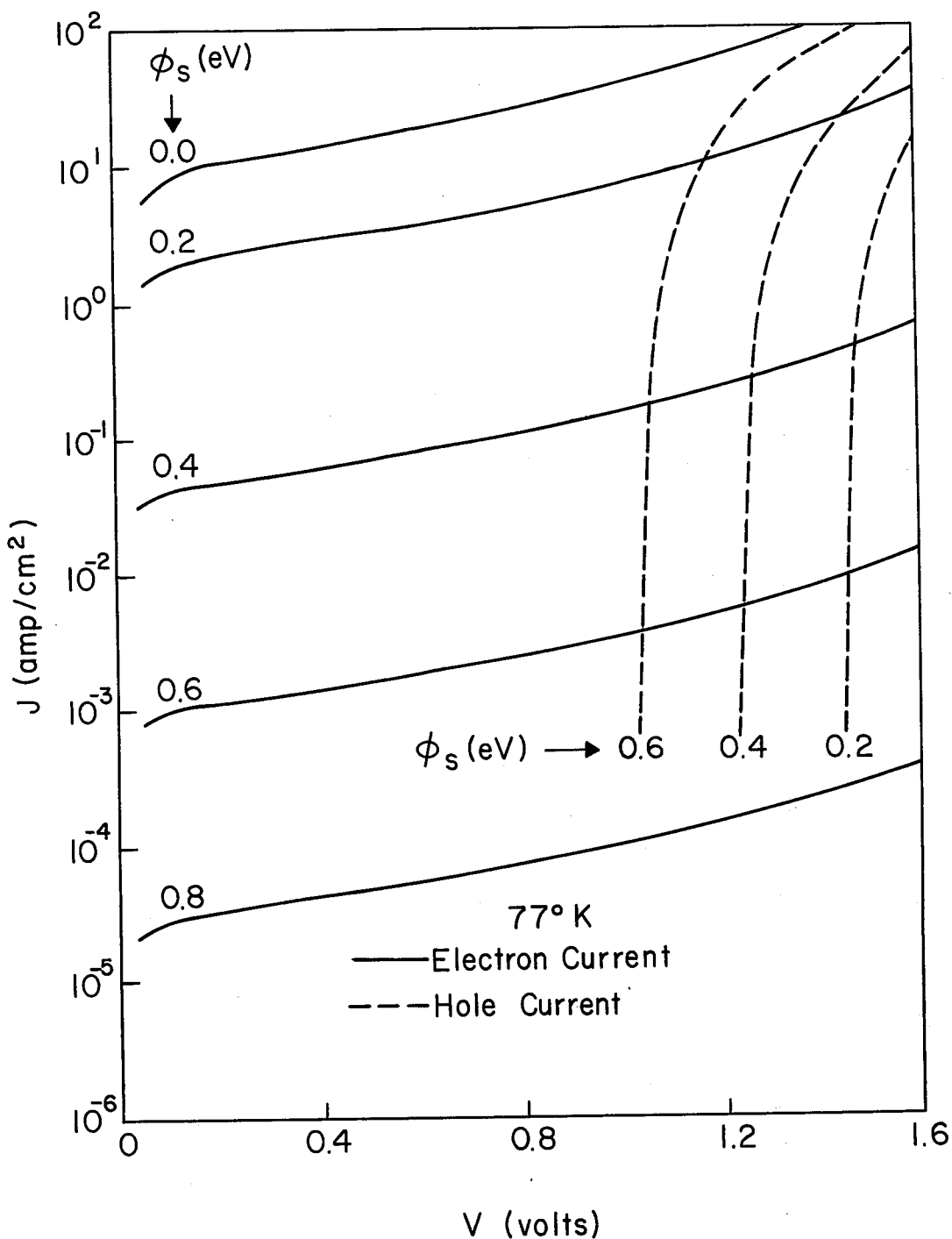
FIG. 7 is a family of curves showing the current-voltage characteristics of an MIS tunnel junction as a function of band-bending in the semiconductor ($\phi$).

The results of a sample calculation for an Al-Al$_2$O$_3$-GaAs structure are shown in FIG. 7 which shows current-voltage curves for tunneling from the valence band and one-step tunneling from the conduction band (steps $a$ and $b$, respectively, in FIG. 5) for various values of $\phi_s$. The effective masses for the semiconductor tunneling barrier are the electron mass 0.068m, and the light hole mass 0.082m. For the insulator, we used $m_c = m_v = 0.4$m, and $\phi_m = 2.0$ eV which provided good fits to Al-Al$_2$O$_3$-Al tunneling characteristics. The hole current is the sum of currents for the light and heavy hole bands, assumed parabolic for simplicity.

FIG. 7 shows that the band-bending in the semiconductor decreases the electron (majority carrier) current drastically. On the other hand, at any bias past the threshold, the hole (minority carrier) current increases with increasing $\phi$. When $\phi_s = 0$, the electron current at any voltage is substantially higher than the hole current (not shown in FIG. 7), resulting in a poor minority carrier injection efficiency. However, when $\phi_s$ is equal to, say, 0.6 eV, the hole current, once set on, is several decades above the electron current. This corresponds to a minority carrier injection efficiency of nearly unity.

The electron current in FIG. 7 shows a relatively weak increase with voltage. This increase is due entirely to the bias variation of the tunneling probability because once the metal Fermi level drops below the conduction band edge, further increase in voltage does not "uncover" any occupied states in the semiconductor from which one-step tunneling can occur.

In electroluminescent MIS structures, the luminescence-voltage characteristics should resemble the hole current-voltage characteristics. This is found to be true by comparing the I(V) curves of FIG. 7 and the luminescence-voltage curves in FIG. 2. If $\phi_s$ remains independent of bias, the I(V) curves of MIS structures should show a sharp jump at the onset of hole tunneling. This structure may be partly or completely lost due to the voltage dependence of $\phi_s$.

For an insulator $E(k)$ relation as in FIG. 6, it is possible that band-bending in the semiconductor ($\phi_s > 0$) may increase the electron current. If $\phi_1$ is approximately equal to or greater than the value of $\epsilon$ for which $-k^2$ is a maximum, then band-bending may increase tunneling probability through the insulator sufficiently to overcome reduced tunneling probability through the semiconductor space charge region. However, hole tunneling would also increase so that hole injection efficiency should again be high.

In conclusion, it has been shown that, in MIS structures the majority carrier transport is dominated by transport through the band-bending region of the semiconductor. Utilizing this property, near-unity efficiencies for minority carrier injection can be achieved. The illustrated I(V) curves for electron and hole tunneling in MIS structures, have taken into account the band-bending in the semiconductor and use asymmetric two-band models for the E(k) relation of both the semiconductor and the insulator.

A similar argument applies to the case of electron-injection in a p-type semiconductor where the polarity of interface charges is reversed so as to maintain a depletion region in the p-type semiconductor.

A similar theory also applies to the case where the metal electrode is replaced by a semiconductor thereby producing what is known in the art as a semiconductor-insulator-semiconductor (SIS) device.

While in accordance with the Patent Statutes I have illustrated and described the preferred form of the invention, it will be apparent to those skilled in the art that various changes and modifications may be made without deviating from the inventive concepts set forth above.

What is claimed is:

1. In a multilayer thin-film device having adjacent insulator and semiconductor layers and producing an increased luminescence efficiency, the improvement which comprises:
   means to maintain a charge near the insulator-semiconductor interface of proper polarity and sufficient magnitude to create a depletion region in said semiconductor layer that substantially reduces majority carrier tunneling from the conduction band of said semiconductor layer and enhances minority carrier injection into said semiconductor layer and the resulting luminescence.

2. A device according to claim 1, wherein said means to maintain a charge includes means for introducing a surface state at said insulator-semiconductor interface which produces said depletion region.

3. A device according to claim 1 wherein said multilayer thin-film device is of the semiconductor-insulator-semiconductor (SIS) type.

4. A device according to claim 1 wherein said means to maintain a charge near the insulator-semiconductor interface includes a semiconductor surface adjacent to said insulator which is substantially free of oxides and contaminants.

5. A device according to claim 4 wherein said semiconductor surface which is substantially free of oxides and contaminants is produced by cleaning in the presence of high vacuum.

6. A device according to claim 5 wherein said cleaning employs sputter-etching or ion-milling.

7. A multilayer thin-film device for producing electroluminescence, comprising:
   a first layer of semiconductor material;
   means forming a depletion region at a first surface of said semiconductor layer;
   a second, thin-film layer of insulator material deposited on said first surface of said semiconductor layer;
   a third layer of metal material deposited on said insulator material;
   means for applying a bias voltage across said device, said bias voltage and said depletion region cooperating to produce band-bending in the energy band gap of said semiconductor adjacent the interface between said first and second layers to substantially reduce majority carrier tunneling from the conduction band of said first layer to said third layer, and to lower the voltage threshold for minority carrier tunneling into said first layer from said third layer to less than the band gap of said semiconductor material of said first layer whereby minority carrier tunneling is enhanced to produce improved electroluminescence.

8. The device of claim 7, wherein said first layer is GaAs, said second layer is $Al_2O_3$, and said third layer is Al.

* * * * *